(12) United States Patent
Levermore

(10) Patent No.: US 8,622,562 B2
(45) Date of Patent: Jan. 7, 2014

(54) 3D LIGHT EXTRACTION SYSTEM WITH UNIFORM EMISSION ACROSS

(75) Inventor: Peter Levermore, Lambertville, NJ (US)

(73) Assignee: Universal Display Corporation, Newark, NJ (US)

( * ) Notice: Subject to any disclaimer, the term of this patent is extended or adjusted under 35 U.S.C. 154(b) by 448 days.

(21) Appl. No.: 12/977,882

(22) Filed: Dec. 23, 2010

(65) Prior Publication Data

US 2012/0162995 A1    Jun. 28, 2012

(51) Int. Cl.
*F21V 9/16*    (2006.01)

(52) U.S. Cl.
USPC ....... 362/84; 362/97.3; 362/311.02; 362/330; 313/504; 313/506

(58) Field of Classification Search
USPC ............. 362/84, 97.3, 311.02, 330, 355, 800; 313/504, 506
See application file for complete search history.

(56) References Cited

U.S. PATENT DOCUMENTS

| | | | |
|---|---|---|---|
| 6,952,079 B2 | 10/2005 | Shiang et al. | |
| 2007/0108900 A1 | 5/2007 | Boek et al. | |
| 2011/0122053 A1* | 5/2011 | Jeong et al. | 345/76 |
| 2011/0122628 A1* | 5/2011 | Han | 362/267 |
| 2012/0161610 A1* | 6/2012 | Levermore et al. | 313/504 |

OTHER PUBLICATIONS

D'Andrade, et al., *Organic light-emitting device luminaire for illumination applications*, Applied Physics Letters 88, 192908 (2006), Epub May 11, 2006, 3 pages.
Levermore, et al., *Pushing the Envelope for PHOLED Lighting*, 7th Organic Semiconductor Conference, London, UK, Sep. 2009, 31 pages.
Levermore, et al., *52.4: Highly Efficient Phosphorescent OLED Lighting Panels for Solid State Lighting*, SID 2010, Seattle, USA, May 2010, 4 pages.
Reinke, et al., *White organic light-emitting diodes with fluorescent tube efficiency*, Nature, Letters, vol. 459, 2009, 6 pages.
International Search Report for International Application No. PCT/US2011/066619, mailed Apr. 2, 2012, 3 pages.

* cited by examiner

*Primary Examiner* — Stephen F Husar
(74) *Attorney, Agent, or Firm* — Sterne, Kessler, Goldstein & Fox P.L.L.C.

(57) ABSTRACT

Systems and methods for OLED lighting panels are provided in which a light extraction block is optically coupled to a light source. The light extraction block includes a plurality of non-parallel light emitting surface normals. At least one light diffusing layer covers a surface of the light extraction block. The light diffusing layer may be positioned, for example, on a light emitting surface of the light extraction block and/or on a mating surface of the light extraction block. The plurality of light emitting surface normals may be located on different non-parallel light emitting surfaces of the light extraction block, or on different points of a curved emitting surface. All of the light emitting surfaces and/or the mating surface, of the light extraction block may be covered by a light diffusing layer. The optical emission intensity and/or the optical emission color from the plurality of light emitting surface normals may be substantially equal.

26 Claims, 11 Drawing Sheets

3D LIGHT EXTRACTION SYSTEM WITH UNIFORM EMISSION ACROSS

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

An ongoing challenge for the OLED lighting industry is to improve the efficacy of OLED lighting panels through improved light extraction. At the present time, OLED lighting panel efficacy is limited by light loss through waveguiding in the OLED stack. For example, in a typical planar bottom-emission OLED with no additional light extraction fixtures only as little as 20% of the generated photons can escape from the OLED stack and be emitted as useful illumination. The remaining photons are waveguided in the OLED stack.

For example, FIG. 1 depicts a simplified ray diagram of a planar OLED demonstrating light loss through substrate and anode/organic layer waveguiding. In general, only a small fraction of light emitted relatively close to the surface normal ($<\theta_C$) is outcoupled.

As shown in FIG. 1, light generated in an OLED can be classified into three radiative modes: the outcoupled mode, the substrate waveguided mode and the anode/organic waveguided mode. Depending on the angle of emission $\theta$, photons are outcoupled as useful emission, or waveguided into the substrate or anode/organic layers. The only outcoupled modes are those with angle to the surface normal less than the critical angle $\theta_C$, where $\theta_C = \sin^{-1}(n_{air}/n_{org}) \approx 36°$ for $n_{org} = 1.7$. Substrate modes are emitted through the edges of the substrate, whereas anode/organic modes are heavily attenuated by self-absorption, and do not emit through the edge.

Some improvement in light extraction efficiency may be obtained through the use of a light extraction block. The light extraction block may be optically connected to the OLED substrate emissive surface. An example of such an approach is detailed in U.S. Pat. No. 6,952,079 to Shiang et al. (hereinafter "Shiang"). According to Shiang, a "luminaire" with a planar emitting surface may be provided with a recess to receive an OLED device. The luminaire includes sharply angled sides that extend at a relatively shallow acute angle, and are coated with a highly reflective material. Thus, the acutely angled sides and reflective material direct light towards the planar front surface of the luminaire.

An alternative approach is described in D'Andrade & Brown, APL (2006) (hereinafter "D'Andrade"), which describes an OLED device with a truncated square-pyramid luminaire.

Although the above techniques have proven to be somewhat more effective in terms of light extraction enhancement, they still suffer from a number of shortfalls that limit their efficiency and utility. For example, configurations such as Shiang and D'Andrade do not provide uniform emission intensity and color across all viewing angles. In this regard, Shiang is limited to an illumination from the front surface that lies parallel to the rear surface, and does not enhance any illumination away from the front surface normal. Thus, there is little or no 3-dimensional illumination provided by Shiang. D'Andrade also suffers from drawbacks in terms of uniform emission intensity and color with viewing angle, and exhibits a strong color shift with viewing angle, depending on which surface light is emitted from.

In view of the foregoing, there are continuing needs for improved means for improving the efficiency and utility of OLED light sources, including, for example, means for providing improved light extraction enhancement, as well as more uniform, apparently 3-dimensional, OLED light sources.

BRIEF SUMMARY OF THE INVENTION

According to aspects of the present invention, light extraction blocks of differing shapes may be combined with light diffusing, or "scattering," layers on various emissive and/or other surfaces. In embodiments, some, or essentially all, emissive surfaces of the light extraction block may be coated with a light diffusing layer. Through combinations of 3-dimensional light extraction block shapes, including multiple emitting surfaces and/or multiple emitting surface normals, an approximately uniform emission intensity and color may be achieved across a wide range of, or substantially all, viewing angles.

According to yet further aspects of the invention, a substantially 2-dimensional light source, such as an OLED emissive surface, may be converted to an apparently 3-dimensional light source. Systems and methods described herein may also be used to improve illumination away from a surface normal, as well as perform other functions, such as, hiding imperfections, mixing colors effectively, and/or disguising pixilation or shorted sub-pixels.

According to embodiments, lighting panels may be provided with a light source including an OLED panel. A light extraction block may be optically coupled to the light source and may include a plurality of non-parallel light emitting surface normals. In embodiments, the plurality of non-parallel light emitting surface normals may be included, for example, on different non-parallel light emitting surfaces, such as non-parallel substantially planar surfaces of the light extraction block, and/or on different points of one or more curved emitting surfaces.

According to embodiments, a light diffusing layer may be included at least partially covering a surface of the light extraction block. In embodiments, the at least partially covered surface may be, for example, an emitting surface and/or a mating surface between the light extraction block and the OLED panel.

According to embodiments, substantially all light emitting surfaces of the light extraction block may be covered by a light diffusing layer. In embodiments, a light diffusing layer may be located between the light extraction block and the light source. Alternatively, no light diffusing layer may be located between the light extraction block and the light source.

According to embodiments, the light source may be substantially flush with, or at least partially inset within, the light extraction block.

According to embodiments, at least one of an optical emission intensity and an optical emission color from the plurality of light emitting surface normals may be substantially equal.

According to embodiments, the light extraction block may include at least one of an emitting surface that is in a non-parallel plane to that of a light emitting surface of the light source, and/or a curved emitting surface.

According to embodiments, a height of the light extraction block may be between 3 mm and 50 mm. In other embodiments, a height of the light extraction block may preferably be, for example, approximately 10 mm, approximately 20 mm, and/or sized based on a cross-sectional height of the lighting panel, e.g. less than one third of a cross-sectional height of the lighting panel.

In certain embodiments where at least one of the light emitting surfaces includes a substantially curved surface, a height of the light extraction block may be less than 50% of a width of the light extraction block, or less than 25% of the width of the light extraction block According to embodiments, the light extraction block may be index matched with a light emitting surface of the light source. The index matching may include, for example, an index matching material between the light extraction block and the light emitting surface of the light source. Substantial matching between two refractive indices occurs when the difference between the indices is less than 0.10, and preferably less than 0.05, 0.02 or 0.01.

According to embodiments, the light extraction block may be formed from at least one of glass, acrylic, polycarbonate, quartz, PMMA, PET and PEN. Other materials could also be used for the light extraction block. For example, in certain circumstances, an OLED light panel may be fabricated on a glass substrate with a high refractive index (e.g. n>1.7). In such instances, the light extraction block may be formed of a high index glass or plastic with similarly high refractive index.

According to other aspects of the invention, a light extraction block for use with a lighting panel, may include at least one light emitting surface, a plurality of non-parallel light emitting surface normals, and a light diffusing layer positioned along at least one surface of the light extraction block. In embodiments, the light diffusing layer may be positioned along, for example, an emitting surface of the light extraction block and/or a mating surface of the light extraction block.

According to embodiments, substantially all light emitting surfaces of the light extraction block may be covered by a light diffusing layer. In embodiments, a light diffusing layer may be configured to go between the light extraction block and a light source. Alternatively, the light extraction block may be configured with no light diffusing layer to go between it and the light source.

According to embodiments, the light extraction block may be configured such that at least one of an optical emission intensity and an optical emission color from the plurality of light emitting surface normals may be substantially equal when light is emitted to a light receiving surface of the light extraction block.

According to embodiments, the light extraction block may include at least one of an emitting surface that is in a non-parallel plane to that of a light emitting surface of the light source, and/or a curved emitting surface.

According to embodiments, a height of the light extraction block may be between 3 mm and 50 mm. In other embodiments, a height of the light extraction block may preferably be, for example, approximately 10 mm, approximately 20 mm.

In certain embodiments where at least one of the light emitting surfaces of the light extraction block includes a substantially curved surface, a height of the light extraction block may be less than 50% of a width of the light extraction block, or less than 25% of the width of the light extraction block.

According to embodiments, the light extraction block may be formed from at least one of glass, acrylic, polycarbonate, quartz, PMMA, PET and PEN. Other materials could also be used for the light extraction block. For example, in certain circumstances, an OLED light panel may be fabricated on a glass substrate with a high refractive index (e.g. n>1.7). In such instances, the light extraction block may be formed of a high index glass or plastic with similarly high refractive index.

According to embodiments, the OLED panel may include an array of lit and unlit areas and/or an array of multicolored emissive areas. In embodiments, an optical emission intensity and/or an optical emission color from the array of lit and unlit areas may be substantially uniform when viewed through the light extraction block. In embodiments, an optical emission intensity and/or an optical emission color from the array of multicolored emissive areas may be substantially uniform when viewed through the light extraction block.

According to yet further aspects of the invention, methods of manufacturing a light extraction block for use with a lighting panel, may include providing a light extraction block with at least one light emitting surface and a plurality of non-parallel light emitting surface normals, and positioning a light diffusing layer along at least one surface of the light extraction block. Various other methods of manufacturing light extraction blocks for use with a lighting panel, as well as manufacturing other OLED lighting panels including such light extraction blocks, are contemplated as within the scope of the invention, and will be appreciated by those of skill in the art upon understanding the exemplary light extraction blocks described herein.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION OF THE INVENTION

Figure 1:
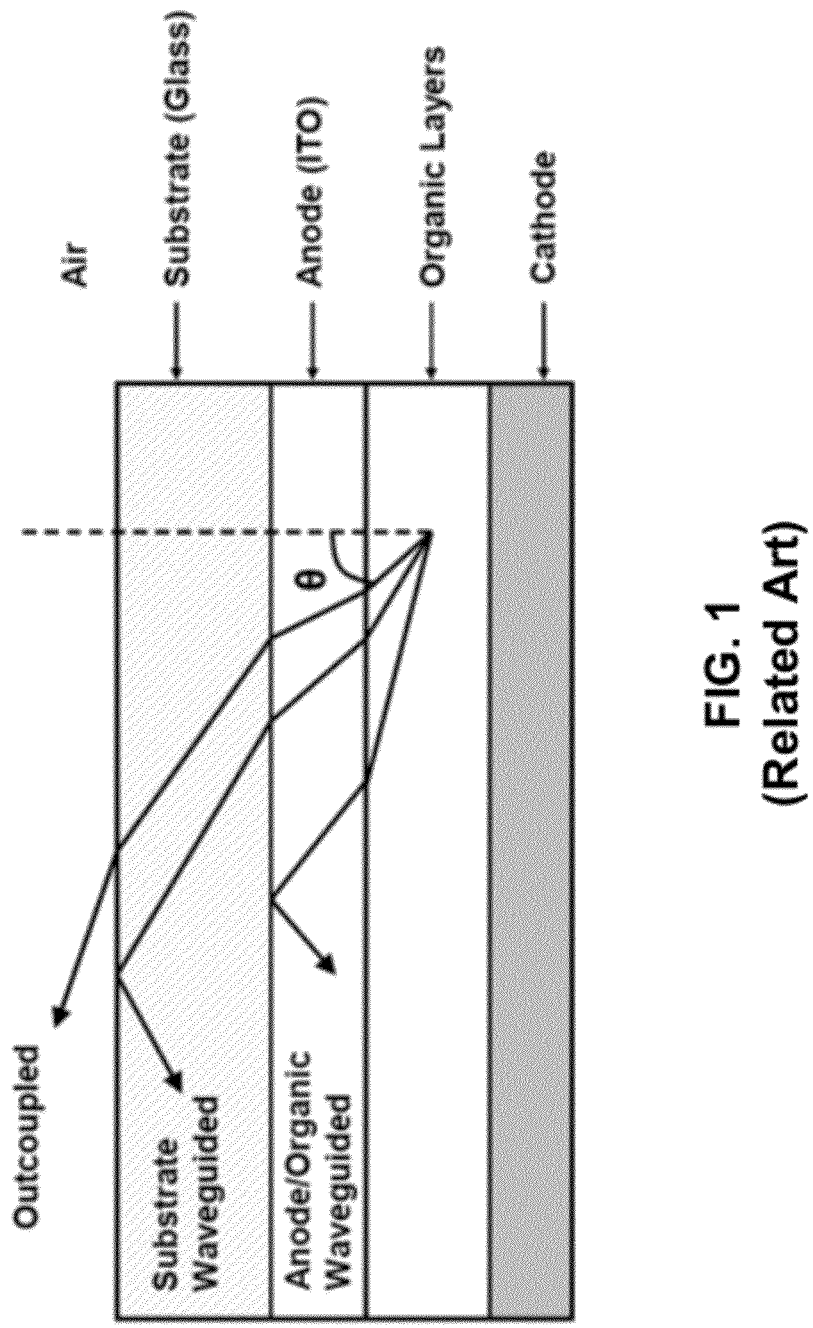
FIG. 1 is a ray diagram of a planar OLED demonstrating light loss through waveguiding.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a surface" is a reference to one or more surfaces and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

For the purposes of this application, any layer may be considered a light diffusing, or scattering, layer if a substantial proportion of photons with wavelength in the visible spectrum that are incident upon that layer are scattered. One possible way in which a light diffusing layer can be defined is in terms of the light scattering anisotropy parameter g, where g is given by the Henyey-Greenstein phase function:

$$P_{HG}(\cos v) = \frac{1 - g^2}{4\pi(1 + g^2 - 2g\cos v)^{3/2}}$$

The light scattering anisotropy parameter g is experimentally accessible. It is defined between −1 and 1. The values −1, 0 and 1 mean mirror-like backscattering, isotropic scattering, and no change in photon trajectory, respectively. Only g factors >0, which imply forward scattering, are relevant here. Therefore, in the broadest embodiment, a light diffusing layer is one where g is the range: $0 < g < 1$.

An alternative means of characterizing a light diffusing layer is in terms of (a) total light transmission $T_{tot}$, (b) parallel light transmission $T_{par}$, (c) diffuse light transmission $T_{diff}$ and (d) haze. Total light transmission is simply a measure of the percentage of light incident upon the light diffusing layer that exits the layer $T_{tot}=T_{in}/T_{out}$. For the purposes of this disclosure $T_{tot}$ should generally be as high as feasible, so as to maximize light extraction enhancement. Preferably $T_{tot}$ should be >70%, and more preferably $T_{tot}$ should be >80% or >90%.

Parallel light transmission is typically measured at normal incidence to the film. It is a measure of the percentage of light incident on the light scattering layer at normal incidence that exits the layer at normal incidence. For the purposes of this disclosure $T_{par}$ should generally be as low as feasible, so as to maximize color and luminance uniformity. Preferably $T_{par}$ should be <20%, and more preferably $T_{par}$ should be <10% or <5%. Diffuse light transmission is simply $T_{diff}=T_{tot}-T_{par}$, and haze is then defined as Haze=$T_{diff}/T_{tot}$. A light diffusing layer will typically have $T_{diff}$ that is substantially higher than 0. For the purposes of this disclosure, haze should generally be as high as feasible, so as to maximize color and luminance uniformity. Preferably, haze should be >80%, and more preferably haze should be >90% or >95%.

Light diffusing layers may be applied to the surface of the light extraction block using a variety of techniques. These techniques include applying an aerogel to the surface, randomly roughening the surface by means such as abrasion or sand-blasting, depositing a particulate layer onto the surface or patterning microspheres, microlenses or periodic nanostructures onto the surface. An alternative approach is to deposit layers of high and/or low refractive index materials onto the surface. These treatments could be applied directly to the surface of the light extraction block, or to a separate thin film, which is then optically connected to the surface. Yet another alternative approach is to optically connect a prism sheet, lens sheet or diffraction grating sheet to the surface. A still further alternative approach is to optically connect a light diffusing layer, such as a diffuser sheet to the surface. The light diffusing layer could comprise multiple layers or light scattering particles is a host matrix, where the layers and/or scattering particles have higher and/or lower index than the light extraction block. The light diffusing layer could also include additional surface texture to enhance light scattering. In this work, a commercial light scattering diffuser sheet (Clarex DR-80C) was optically connected to the substrate surface using index matching fluid having refractive index n=1.5. Any of these techniques could be used in combination with each other.

Figure 2:
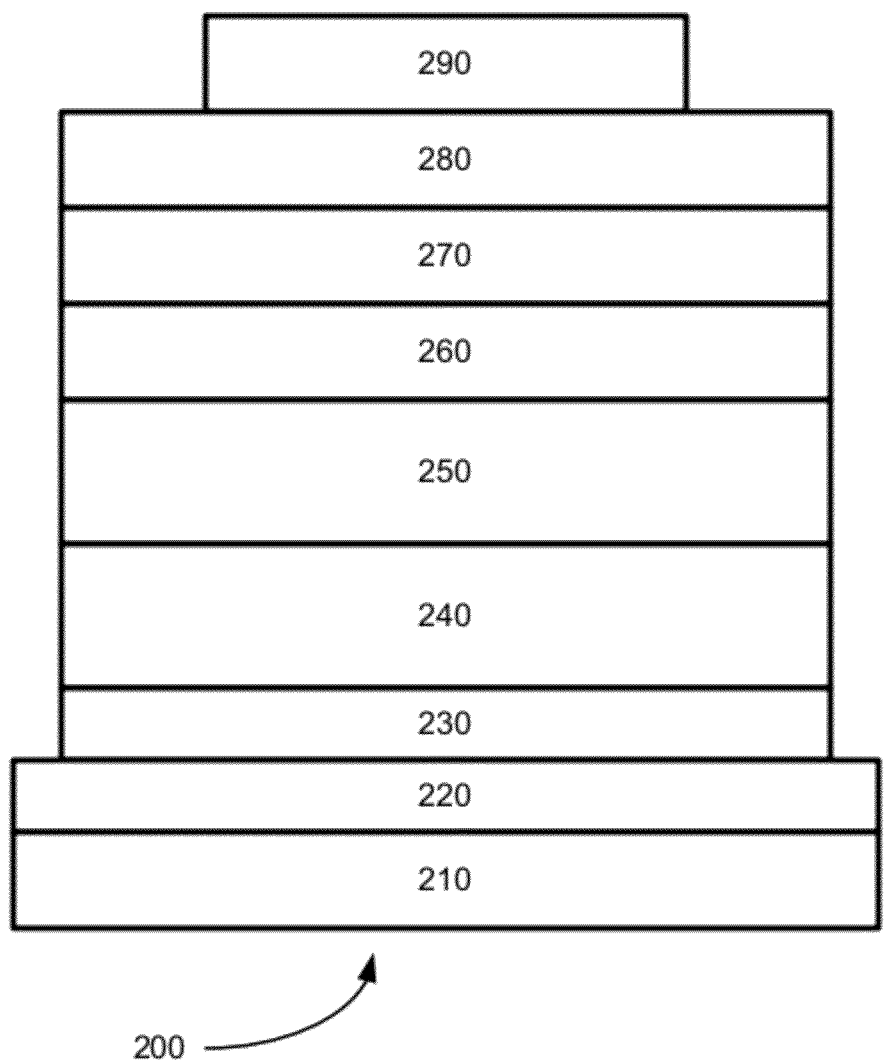
FIG. 2 is a schematic diagram of an OLED device structure as may be used in embodiments of the invention.

According to embodiments, lighting panels may be provided with a light source including an OLED panel. As shown in FIG. 2, an exemplary OLED device stack 200 may include a plurality of material layers 210-290. For example, the device stack 200 may be formed by vacuum thermal evaporation (VTE) deposition onto 70 mm×70 mm soda lime glass substrates having an appropriate refractive index, e.g. n=1.5. OLEDs may be fabricated on a glass substrate 210, and include, in order, an anode 220 (1200 Å thick ITO), a hole injection layer 230 (100 Å thick LG101, available from LG Chemicals of Korea), a hole transport layer 240 (450 Å thick NPD), a first emissive layer 250 (200 Å thick Host B doped with 30% Green Dopant A and 0.6% Red Dopant A), a second emissive layer 260 (75 Å thick Blue Host A doped with 25% Blue Dopant A), a blocking layer 270 (50 Å thick Blue Host A), a layer 280 (250 Å thick layer of 40% LG201, available from LG Chemicals of Korea and 60% LiQ), and a cathode 290 (10 Å thick layer of LiQ (lithium quinolate) and a 1000 Å thick layer of Al). The foregoing materials and dimensions are provided merely by way of example, and should not be interpreted as limiting the scope of the invention. Other configurations for the OLED are also contemplated and will be appreciated by those of skill in the art.

Some examples of the OLED materials that may be used to form the device stack 200 are shown below.

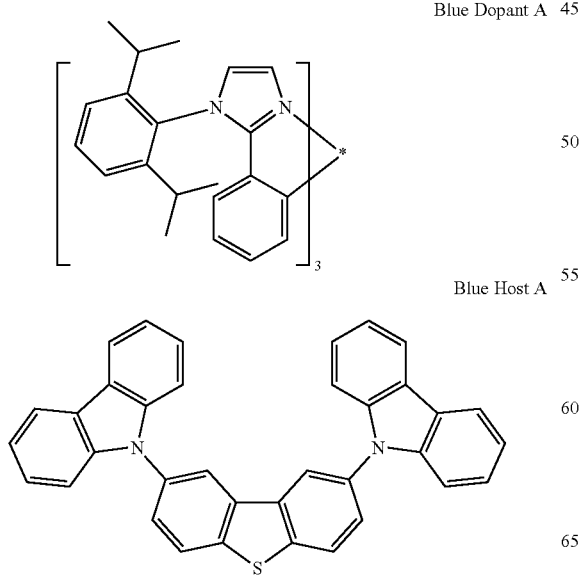

Blue Dopant A

Blue Host A

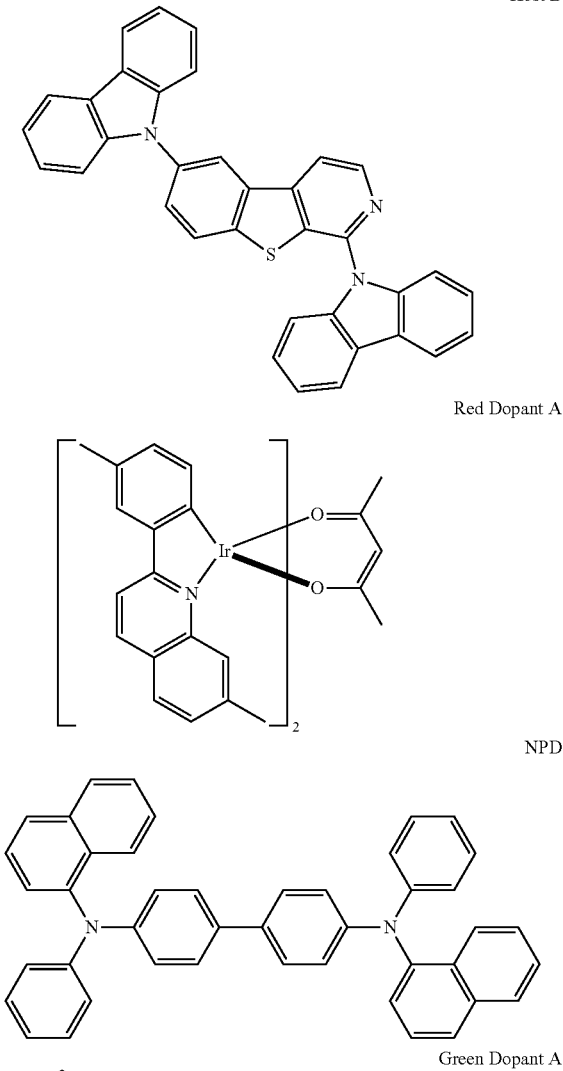

Host B

Red Dopant A

NPD

Green Dopant A

An OLED device, such as shown in FIG. 2, may be incorporated in an OLED panel. An active area of the panel may be defined by, for example, a polyimide grid deposited onto the anode prior to VTE deposition. An exemplary active area layout is shown in FIG. 3.

Figure 3:
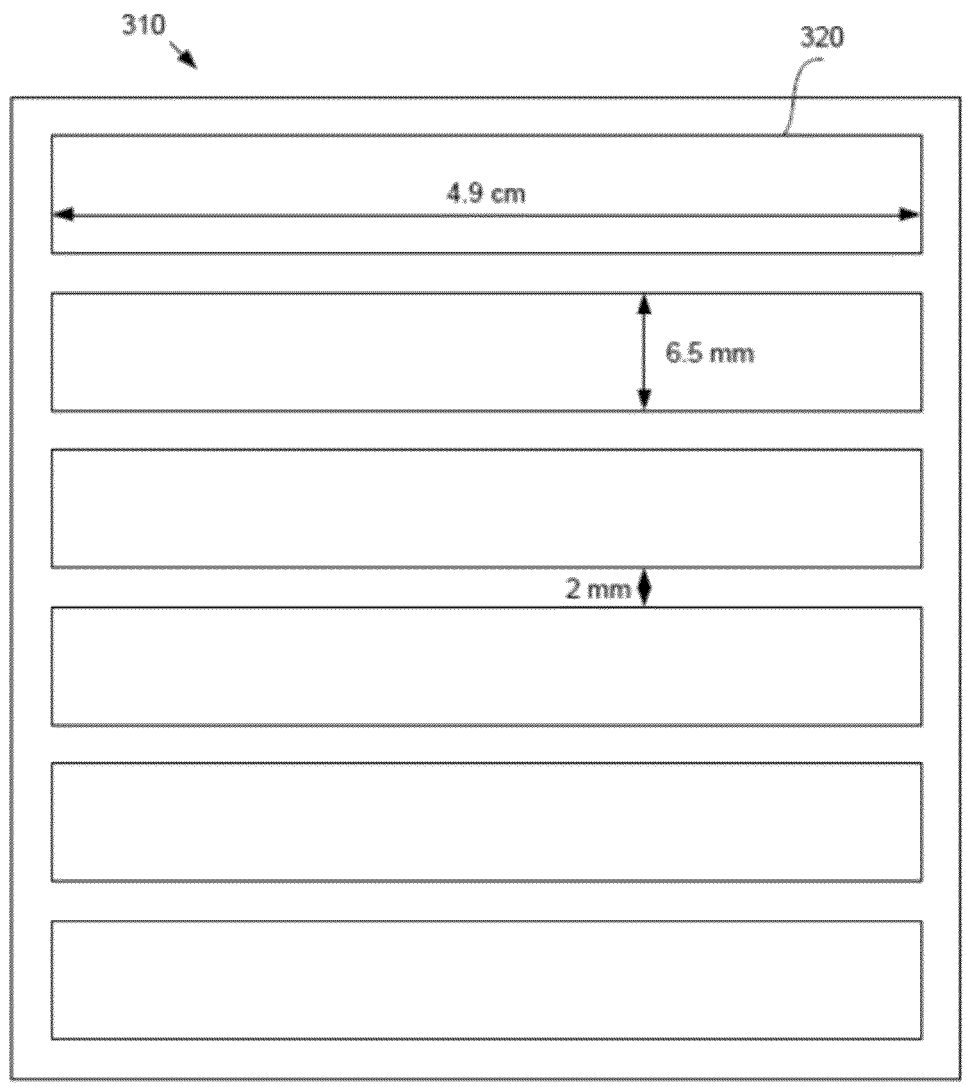
FIG. 3 is a plan view of an exemplary OLED panel according to an embodiment of the invention.

As shown in FIG. 3, an OLED panel may include a plurality of emitting surfaces, which may be configured in various shapes and sizes. The emitting surfaces may include a plurality of multicolor emitters, and/or may be spaced apart from one another by non-emitting regions. In the exemplary panel 310 shown in FIG. 3, six emitting stripes 320 are present. Each of the emitting stripes 320, have a length of 49 mm and a width of 6.5 mm, with 2 mm spacing between each emitting stripe 320. In embodiments, the emitting stripes 320 may include a plurality of emitting colors, e.g. RGB. The outline of the active area is 49 mm×49 mm, thus the panel 310 is substantially square shaped. Other shapes and dimensions of the lighting panel, emitting surfaces, and any non-emitting surfaces are also possible.

Figure 5:
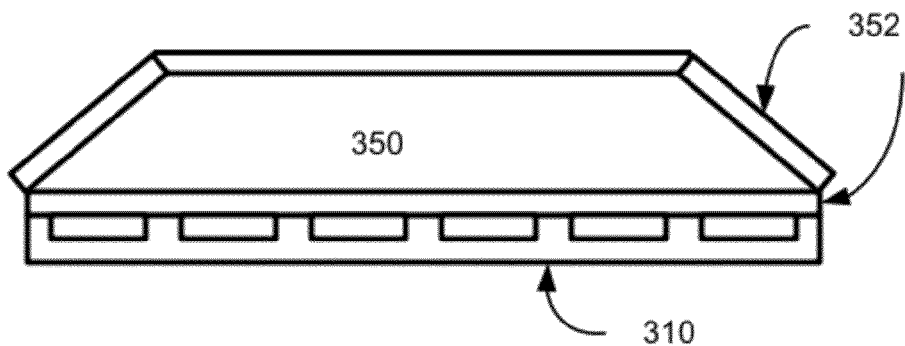
FIG. 5 depicts a cross sectional view of another exemplary OLED panel with a light extraction block according to aspects of the invention.
Figure 6:
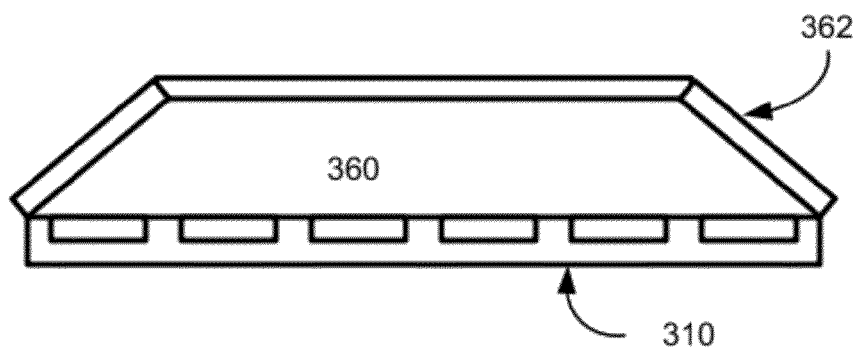
FIG. 6 depicts a cross sectional view of another exemplary OLED panel with a light extraction block according to aspects of the invention.

In embodiments, a lighting panel, such as panel 310, may be optically coupled to a light extraction block. Such optical coupling may include, for example, the light extraction block being index matched with a light emitting surface of the lighting panel, and may include an index matching material between the light extraction block and the light emitting surface of the lighting panel. Substantial matching between two refractive indices occurs when the difference between the indices is less than 0.10, and preferably less than 0.05, 0.02 or 0.01. Examples of a first set of embodiments including a lighting panel optically coupled to a light extraction block are shown in FIGS. 4-6.

Figure 4:
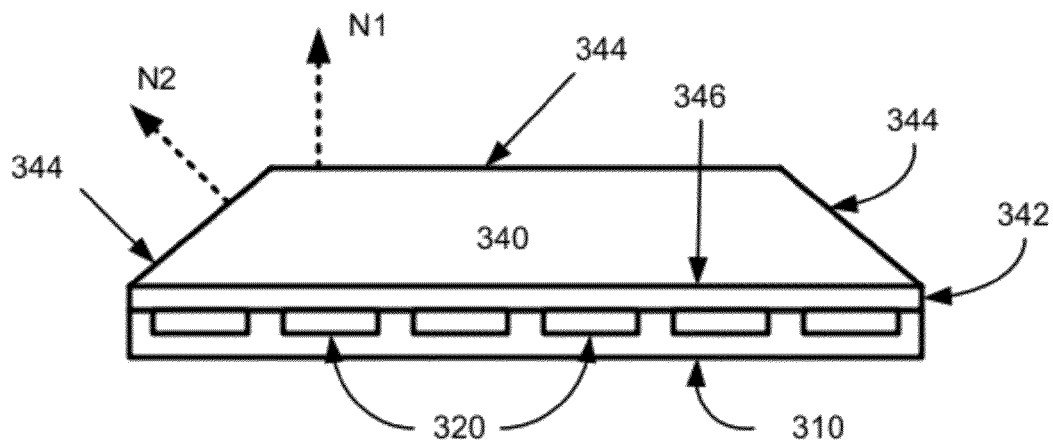
FIG. 4 depicts a cross sectional view of an exemplary OLED panel with a light extraction block according to aspects of the invention.

As shown in FIG. 4, a lighting panel 310 may be optically coupled to a light extraction block 340. Light extraction block 340 may be configured, for example, as a truncated pyramid shape. As further shown in FIG. 4, a diffusing layer 342 may be included between the lighting panel 310 and light extraction block 340. Although the interface between light extraction block 340 and the lighting panel 310 is shown in FIG. 4, and other various figures, as a substantially planar interface, other configurations are also possible, such as, for example, insetting the lighting panel in the light extraction block, curved and/or multi-planar interfaces, etc. As described further herein, the placement of a light diffusing layer between the lighting panel and the light extraction block, such as shown in FIG. 4, may provide advantages in uniformity of emission and color.

The light extraction block 340 also includes a plurality of light emitting surfaces 344, that are not covered by any light diffusing layer. As also shown in FIG. 4, the light extraction block 340 includes a plurality of non-parallel light emitting surface normals, e.g. light emitting surfaces 344 with non-parallel vector normals N1 and N2.

For descriptive purposes, surface 346, and those similarly situated, may be referred to as light receiving surfaces, e.g. surfaces configured to be placed toward, against and/or proximate to a light source such as the surface of OLED panel 310. Surface 346, and those similarly situated, may also be referred to as a non-light emitting surface in that the surface 346 is not configured to emit an appreciable amount of light in operation of the device. An alternative configuration including some similar features is shown in FIG. 5.

As shown in FIG. 5, a lighting panel 310 may be optically coupled to an alternatively configured light extraction block 350. Light extraction block 350 may be configured, for example, as a truncated pyramid shape. As further shown in FIG. 5, a diffusing layer 352 may be included between the lighting panel 310 and light extraction block 350, and also on a plurality of non-parallel light emitting surfaces similar to surfaces 344 shown in FIG. 4. As described further herein, the placement of a light diffusing layer between the lighting panel and the light extraction block, as well as on one or more light emitting surfaces, such as shown in FIG. 5, may provide advantages in uniformity of emission and color, as well as presenting a more 3-dimensional appearing light source. For example, various emissions from emitting stripes 320, which may include a plurality of colors, may appear to be substantially uniform in intensity and/or color when viewed, or projected, through the light extraction block 350, diffusing layer 352, and the like. An alternative configuration including some similar features is shown in FIG. 6.

As shown in FIG. 6, a lighting panel 310 may be optically coupled to an alternatively configured light extraction block 360. Light extraction block 360 may be configured, for example, as a truncated pyramid shape. As further shown in FIG. 6, a diffusing layer 362 may be included on a plurality of non-parallel light emitting surfaces similar to surfaces 344 shown in FIG. 4. As described further herein, the placement of a light diffusing layer on one or more light emitting surfaces, such as shown in FIG. 6, may provide advantages in uniformity of emission and color, as well as presenting a more 3-dimensional appearing light source. For example, various emissions from emitting stripes 320, which may include a plurality of colors, may appear to be substantially uniform in intensity and/or color when viewed, or projected, through the light extraction block 360, diffusing layer 362, and the like.

It should be understood that different portions of light emitting surfaces, e.g. from 0% to 100%, of the light extraction block may be covered with the light diffusing layer, and/or different configurations of light diffusing layers. Although shown typically for ease of description as a single layer covering complete surfaces, various forms of coverage including, for example, patterning, layering, and/or other partial coverages, are contemplated as within the scope of the invention.

Various tests were conducted using different configurations of light extraction blocks and diffusing layers, which demonstrate some of the advantages of using particular combinations of features according to aspects of the invention. For example, a light panel was optically connected to two different light extraction blocks 700, 800 with dimensions shown in FIGS. 7 and 8, respectively. The blocks 700, 800 were made from acrylic and have refractive index=1.5. The blocks 700, 800 were optically connected to the OLED panel using index matching fluid of refractive index=1.5.

Figure 7:
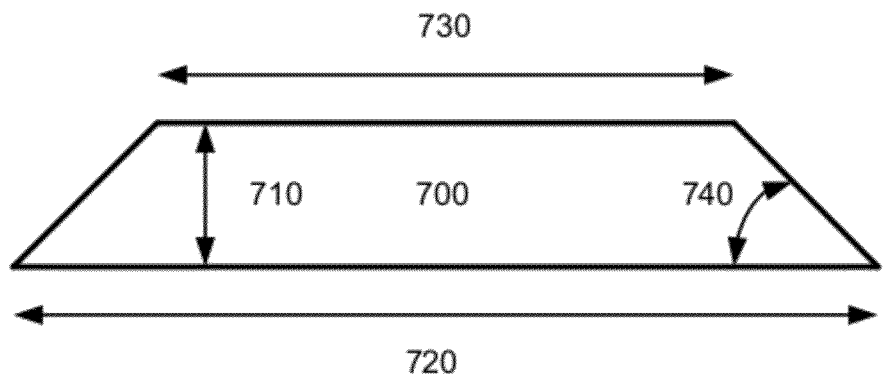
FIG. 7 is a schematic illustration showing a cross sectional view of an exemplary light extraction block according to aspects of the invention.

With reference to FIG. 7, block 700 is a truncated pyramid of height 710=12 mm, base dimensions 720=70 mm×70 mm and upper surface dimensions 730=46 mm×46 mm. The base angle 740=45°.

Figure 8:
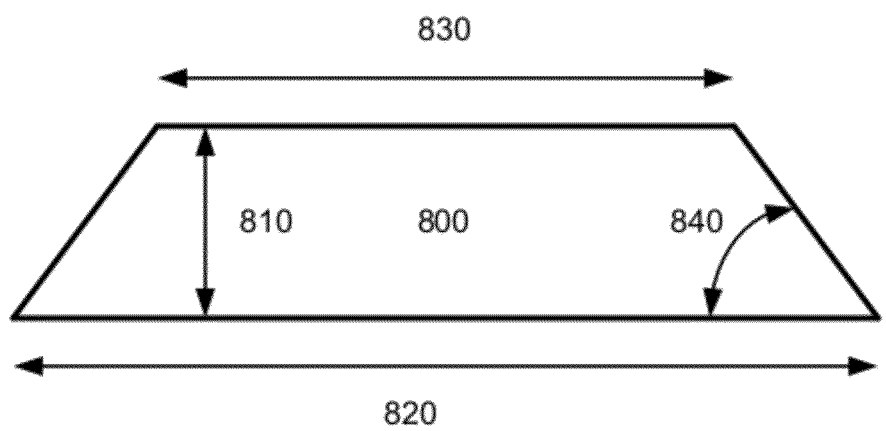
FIG. 8 is a schematic illustration showing a cross sectional view of another exemplary light extraction block according to aspects of the invention.

With reference to FIG. 8, block 800 is also a truncated pyramid of height 810=12 mm, base dimensions 820=70 mm×70 mm and upper surface dimensions 830=56.1 mm×56.1 mm. The base angle 840=60°. Other shapes of block may also be used, including those with at least one surface which can make optical contact to the OLED light panel surface.

Tests also included the use of light diffusion layers with blocks 700, 800. For purposes of the tests, where a light diffusion layer was included, a commercial light diffuser filter was used. This was a Clarex DR-III 80C film of thickness 0.3 mm. This particular diffuser sheet has 80% total light transmission and 77% diffuse light transmission with 3% parallel light transmission and 96% haze. Other diffusers with different optical properties could also be used. Additional descriptions and examples of diffusion and/or scattering layers are discussed further below.

To measure light extraction enhancement, the test OLED panels were placed inside a 20" integrating sphere equipped with an Ocean Optics Spectrometer. Total light emission was measured using 5 different light extraction schemes: (a) OLED panel only, (b) OLED panel+Block, (c) OLED panel+Diffuser Sheet, (d) OLED panel+Diffuser Sheet+Block (diffuser sheet located between OLED panel and block), and (e) OLED panel+Block+Diffuser Sheet (diffuser sheet covers every surface of Block), each of schemes (b), (d) and (e) with a block as in FIG. 7.

In general, scheme (d) OLED panel+Diffuser Sheet+Block 1 (diffuser sheet located between OLED panel and block), is similar to the configuration depicted in FIG. 4, and scheme (e) OLED panel+Block 1+Diffuser Sheet (diffuser sheet covers every surface of Block 1) is similar to the configuration depicted in FIG. 5.

Efficacy, CRI, CCT and CIE 1931 (x, y) were measured at approximately 7.7 lumen total light output. This corresponds to approximately 1,000 cd/m2 light emission from the active area. Data is shown below in Table 1.

TABLE 1

| Light Extraction Scheme | Efficacy [lm/W] | CRI | CCT [K] | CIE 1931 (x, y) | Efficacy Enhancement Compared to (a) Panel Only |
|---|---|---|---|---|---|
| (a) Panel | 33.9 | 80 | 3055 | (0.445, 0.428) | — |
| (b) Panel + Block 1 | 57.9 | 79 | 3550 | (0.414, 0.422) | 1.71x |
| (c) Panel + Diffuser | 48.2 | 79 | 3515 | (0.417, 0.425) | 1.42x |
| (d) Panel + Diffuser + Block 1 | 53.3 | 79 | 3550 | (0.415, 0.424) | 1.57x |
| (e) Panel + Block 1 + Diffuser | 53.6 | 79 | 3550 | (0.415, 0.423) | 1.58x |

Figure 9:
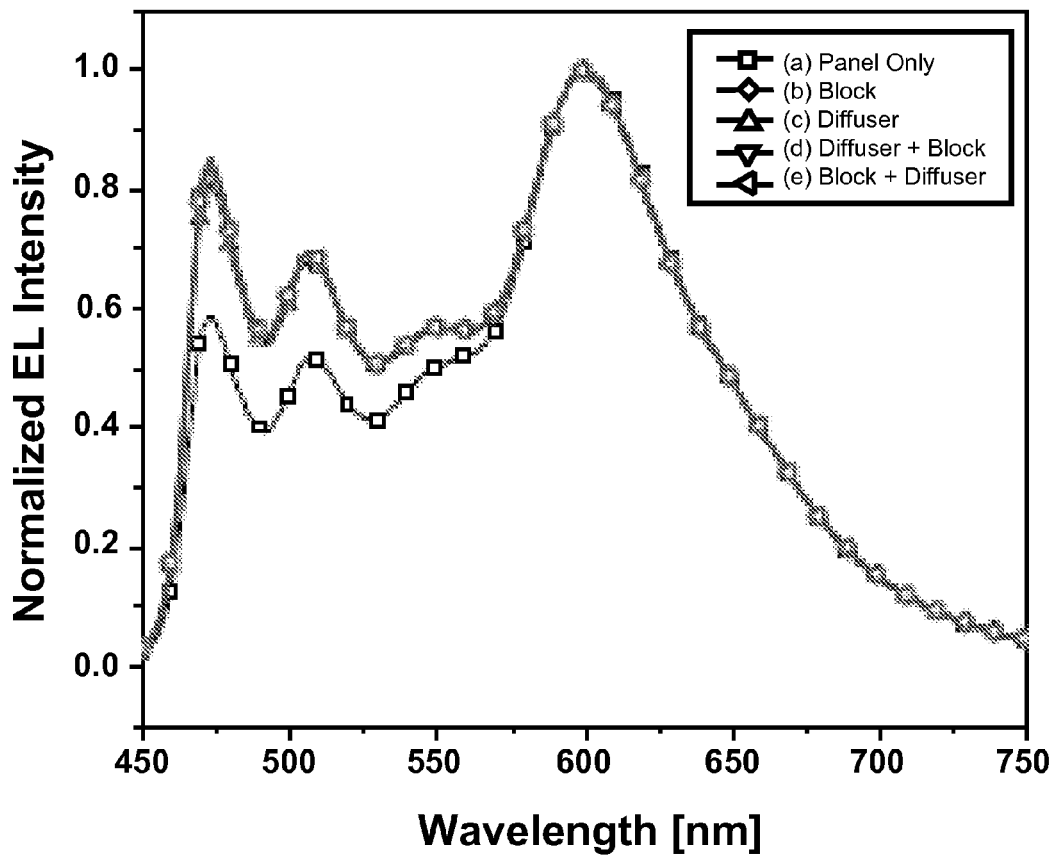
FIG. 9 is a normalized total emission spectra showing results of testing conducted on various light panels and light extraction blocks.

A graph including normalized total emission spectra based on the above test results is included in FIG. 9.

As seen in the test results, without any light extraction enhancement, the OLED panel has efficacy=33.9 μm/W with CIE (x, y)=(0.445, 0.428). When any of light extraction schemes (b-e) are applied to the OLED panel, efficacy is increased and there is a blue-shift in total emission color. Increase in efficacy relative to scheme (a) is shown in the final column. Scheme (e) Panel+Block 1+Diffuser delivers 1.58× efficacy enhancement relative to scheme (a), which is higher than can be achieved using scheme (c) Panel+Diffuser (1.42×). Efficacy and color are approximately the same for schemes (d) and (e). Efficacy for scheme (b) has the highest raw number, however, the inventors have also discovered unique characteristics of schemes (d) and (e), discussed further herein, that provide particular advantages with respect to, for example, uniformity of emission color with viewing angle.

Figure 10:
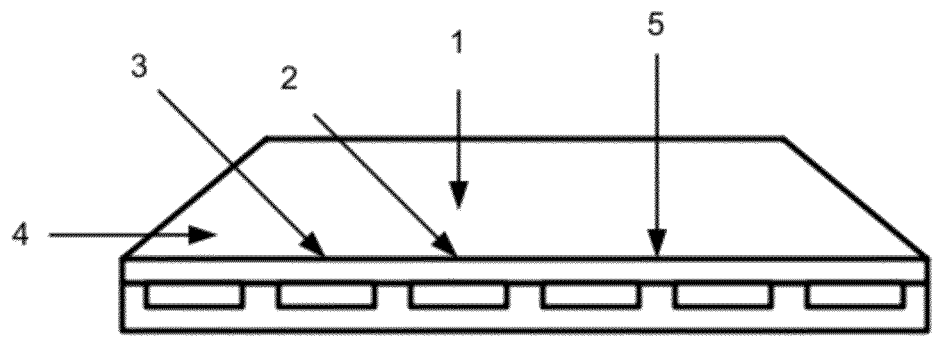
FIG. 10 is a schematic illustration showing positions and angles of incidence representing measurements of emission luminance and color for an exemplary OLED panel as shown in FIG. 4.
Figure 11:
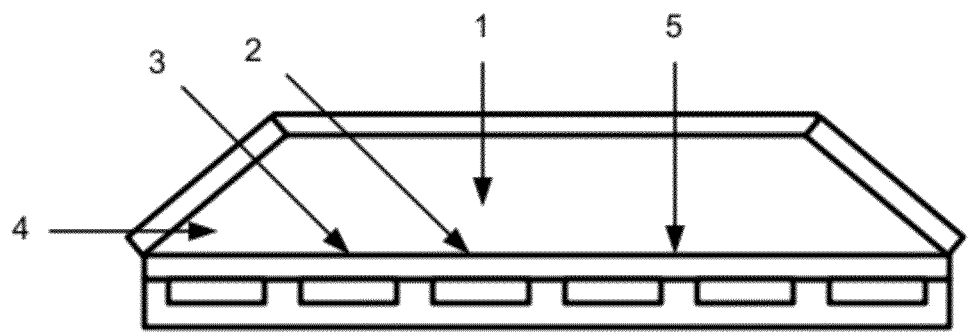
FIG. 11 is a schematic illustration showing positions and angles of incidence representing measurements of emission luminance and color for an exemplary OLED panel as shown in FIG. 5.

Luminance and emission color was measured at various angles and positions for scheme (b) OLED Panel+Block 1, scheme (d) OLED Panel+Diffuser+Block 1, and scheme (e) OLED Panel+Block 1+Diffuser. The positions and angles used for the measurements in schemes (d) and (e) are shown in FIGS. 10 and 11, respectively.

All measurements were taken at a total light output of approximately 7.7 lumen. For each light extraction scheme, there were five measurements of luminance and color. Data are shown below in Table 2.

was also observed qualitatively in photographs of the schemes (not included). Additionally, by comparing 1-4, it is possible to assess uniformity of emission from different emitting surfaces of the light extraction block. For scheme (e), the maximum variation in luminance between 1-4 is only 1.37×. This compares to 1.48× for scheme (d) and 2.09× for scheme (b). The color uniformity for schemes (d) and (e) is excellent, though (e) is slightly better than (d). The color uniformity for (b) is very poor. Thus, although scheme (b) was tested with the highest raw efficacy number, for purposes where color uniformity is desirable across a 3-dimensional emissive surface and from a variety of directions, schemes (d) and (e) show improved performance.

It is desirable in some circumstances that optical emission color from each light emitting surface is substantially the same. This can be quantified in terms of duv (or Δuv)=√($\Delta u'^2 + \Delta v'^2$), which is defined as the distance between color points in CIE 1976 (u', v'). The CIE 1976 (u', v') color space is used in preference over the CIE 1931 (x, y) color space because in the CIE 1976 (u', v') color space distance is approximately proportional to perceived difference in color. The conversion is: $u'=4x/(-2x+12y+3)$ and $v'=9y/(-2x+12y+3)$. For a light panel, a duv<0.020 is preferred, a duv<0.010 is more preferred, and a duv<0.006 is even more preferred. As shown in Table 2 and FIGS. 10 and 11, these parameters may be readily achieved using architectures disclosed herein and variations thereof.

It is also desirable in some circumstances for the optical emission intensity from each light emitting surface to be substantially the same. Emission intensity varies with angle relative to the emission surface, so measurement angle with respect to each emitting surface should be fixed for a fair comparison of optical emission intensity. For example, measurements 1 and 3 in Table 2 and in FIGS. 10 and 11 are taken at normal incidence to two different light emitting surfaces. Luminance Uniformity is defined as $L_{min}/L_{max}$ at normal incidence to each light emitting surface. For a light panel, a Luminance Uniformity>80% is preferred, Luminance Uni-

TABLE 2

| Extraction Scheme | 1 | 2 | 3 | 4 | 5 |
|---|---|---|---|---|---|
| (b) Block 1 | 588 cd/m² (0.435, 0.403) | 674 cd/m² (0.431, 0.417) | 968 cd/m² (0.385, 0.421) | 463 cd/m² (0.384, 0.369) | 6 cd/m² (0.423, 0.419) |
| (d) Diffuser + Block 1 | 696 cd/m² (0.415, 0.412) | 707 cd/m² (0.410, 0.412) | 615 cd/m² (0.403, 0.412) | 475 cd/m² (0.403, 0.412) | 84 cd/m² (0.389, 0.411) |
| (e) Block 1 + Diffuser | 611 cd/m² (0.411, 0.412) | 605 cd/m² (0.412, 0.412) | 595 cd/m² (0.409, 0.414) | 446 cd/m² (0.406, 0.412) | 606 cd/m² (0.418, 0.415) |

Luminance uniformity across the front surface can be assessed by comparing columns (directions) 1 with 5. Light extraction scheme (e) was shown to provide uniform emission luminance and color across the entire front surface. This formity>90% is more preferred, and a Luminance Uniformity>95% is even more preferred. As shown in Table 2 and FIGS. 10 and 11, these parameters may be readily achieved using architectures disclosed herein and variations thereof.

Figure 13:
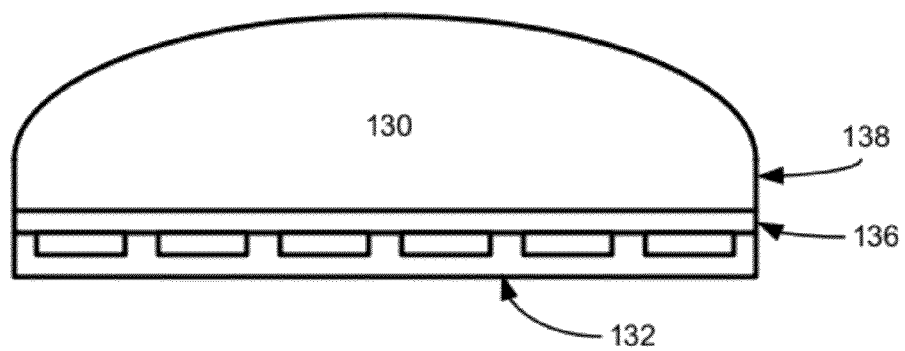
FIG. 13 depicts a cross sectional view of another exemplary OLED panel with a light extraction block having an oblate curve and partial sidewalls according to aspects of the invention.
Figure 14:
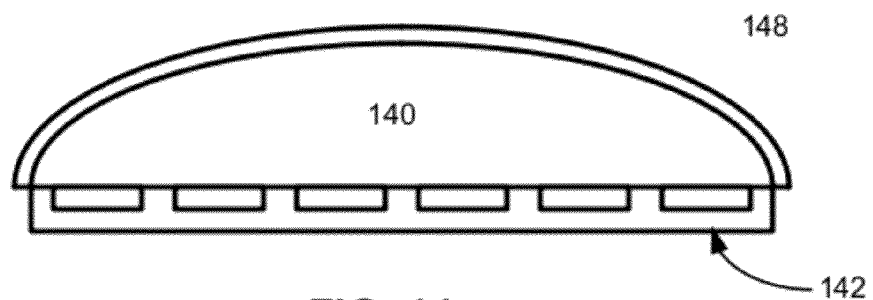
FIG. 14 depicts a cross sectional view of another exemplary OLED panel with a light extraction block having an oblate curve according to aspects of the invention.

Although described above in the context of truncated pyramid light extraction blocks, principles of the invention are applicable to a range of shapes, dimensions and configurations. For example, additional configurations with curved emitting surfaces are shown in FIGS. 12-14.

Figure 12:
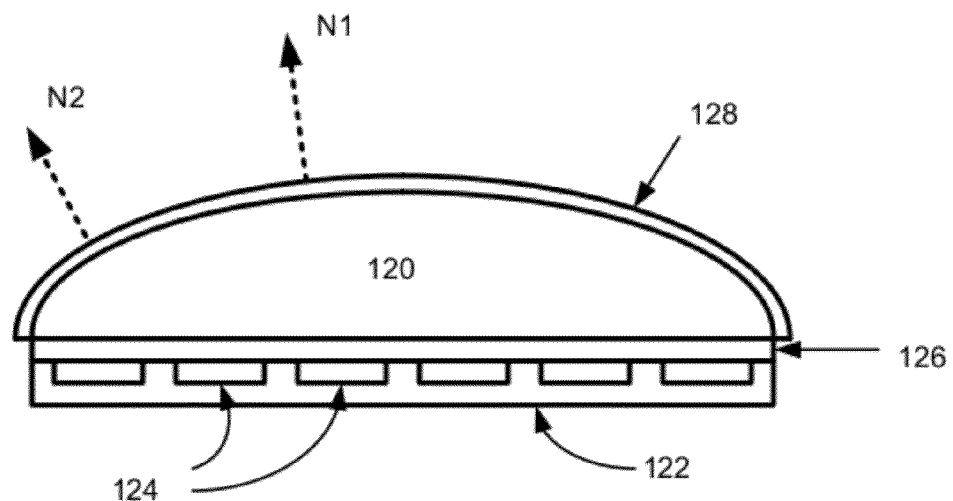
FIG. 12 depicts a cross sectional view of an exemplary OLED panel with a light extraction block having an oblate curve according to aspects of the invention.

As shown in FIG. 12, a lighting panel 122 may include light emitters 124 and be optically coupled to a light extraction block 120. Light extraction block 120 may be configured, for example, partial oblate sphere, a partial cylinder or other shape including a curved surface. As generally shown in FIG. 12, a light emitting surface of the light extraction block 120 has a relatively large radius of curvature compared to a height of the block. In embodiments, this may include a height of the light extraction block being less than 50% of a width of the light extraction block, e.g. a partial cylinder or less than a hemisphere; or less than 25% of the width of the light extraction block, e.g. a portion of an oblate spheroid. Such dimensions may be beneficial, for example, in producing a relatively thin form OLED panel with at least some 3-dimensional lighting capability, which may be further improved by the inclusion of one or more diffusing layers.

For example, with further reference to FIG. 12, a diffusing layer 126 may be included between the lighting panel 122 and light extraction block 120, and a diffusing layer 128 may substantially cover the light emitting surface of light extraction block 120. As described further herein, the placement of a light diffusing layer between the lighting panel and the light extraction block, and on the light emitting surface, such as shown in FIG. 12, may provide advantages in uniformity of emission and color, as well as presenting a more 3-dimensional appearing light source.

The light extraction block 120 also includes a plurality of non-parallel light emitting surface normals, e.g. a curved light emitting surface with non-parallel vector normals N1 and N2. An alternative configuration including some similar features is shown in FIG. 13.

As shown in FIG. 13, a lighting panel 132 may be optically coupled to an alternatively configured light extraction block 130. Light extraction block 130 may be configured, for example, as a generally dome shaped lamp with sidewalls 138. As further shown in FIG. 13, a diffusing layer 136 may be included between the lighting panel 132 and light extraction block 130. As described further herein, the placement of a light diffusing layer between the lighting panel and the light extraction block may provide advantages in uniformity of emission and color. An alternative configuration including some similar features is shown in FIG. 14.

As shown in FIG. 14, a lighting panel 142 may be optically coupled to an alternatively configured light extraction block 140. Light extraction block 140 may be configured, for example, as a partial oblate sphere, a partial cylinder or other shape including a curved surface. As will be further understood based on the configuration shown in FIG. 14, a diffusing layer 148 may be included on at least part of a light emitting surface including a plurality of non-parallel light emitting surface normals, similar to normals N1, N2 depicted in FIG. 12. As described further herein, the placement of a light diffusing layer on one or more light emitting surfaces, with multiple non-parallel light emitting surface normals, such as shown in FIG. 14, may provide advantages in uniformity of emission and color, as well as presenting a more 3-dimensional light source. Additional shapes, including surfaces with multiple curves, segments, and combinations thereof are also contemplated without departing from the scope of the invention.

The inventors have also found that the concepts included herein, such as applying light diffusing layers to one or more light emitting surfaces can provide benefits in lighting panels with other shapes, for example, shapes with inverted sloped sidewalls. For example, as shown in FIG. 15, a light extraction block 150 may include inverted slope sidewalls 152, such as forming an inverted truncated pyramid.

Figure 15:
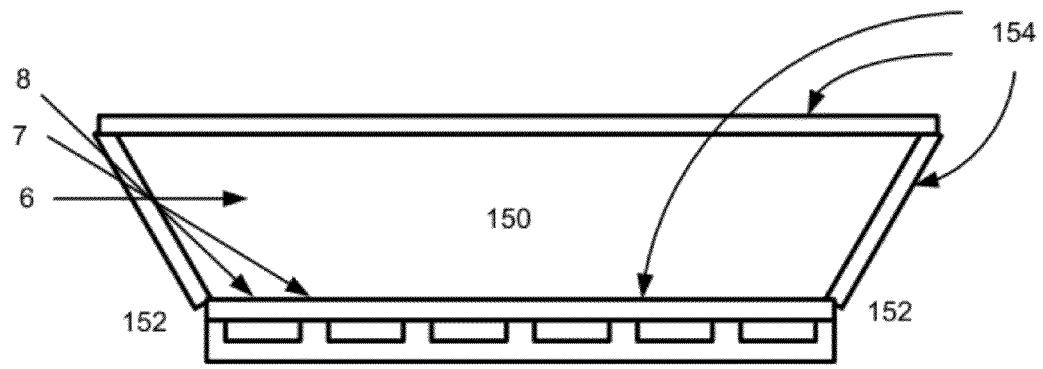
FIG. 15 depicts a cross sectional view of another exemplary OLED panel with a light extraction block having an inverted slope according to aspects of the invention.

In FIG. 15, for the light extraction scheme, the block is inverted compared to the previously discussed measurements. All surfaces of the light extraction block 150, including the light emitting surfaces and the mating surface, are covered by a light diffusing layer 154 (in this case a diffuser sheet).

Figure 16:
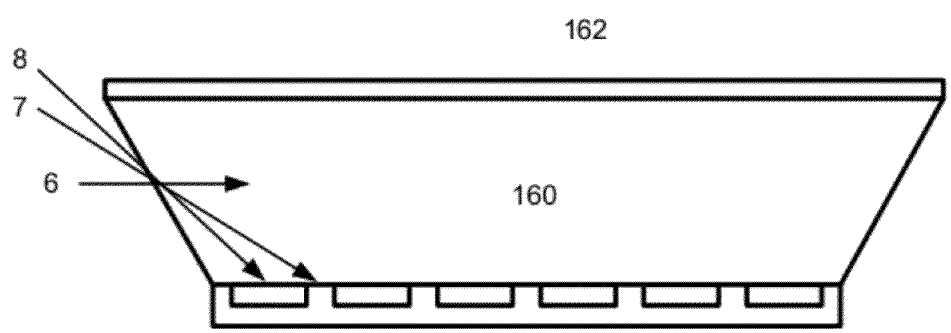
FIG. 16 depicts a cross sectional view of another exemplary OLED panel with a light extraction block having an inverted slope according to aspects of the invention.

An alternative testing configuration is shown in FIG. 16, in which a light extraction block 160 includes a light diffusing layer 162 only on the front surface.

For both the test objects of FIGS. 15 and 16, a light extraction block configured as in FIG. 8 was used. For the test objects of FIGS. 15 and 16, three measurements of luminance and emission color were taken at different angles through the tapered side of the block. The position and angle of measurement is shown in FIGS. 15 and 16. Measurement 6 is directed across the plane of the OLED panel surface, measurement 7 is directed at the gap between the $1^{st}$ and $2^{nd}$ emission stripes, and measurement 8 is directed at the $1^{st}$ emission stripe. Data for measurements 6-8, including luminance and emission color, are summarized in Table 3 below, in which the device of FIG. 15 corresponds to scheme (e), and the device of FIG. 16 corresponds to scheme (f).

TABLE 3

| Extraction Scheme | 6 | 7 | 8 |
|---|---|---|---|
| (e) Block 1 + Diffuser (all surfaces) | 321 cd/m$^2$ (0.398, 0.403) | 283 cd/m$^2$ (0.397, 0.401) | 253 cd/m$^2$ (0.397, 0.403) |
| (f) Block 1 + Diffuser (front surface only) | 330 cd/m$^2$ (0.400, 0.397) | 105 cd/m$^2$ (0.402, 0.410) | 450 cd/m$^2$ (0.400, 0.397) |

Advantages can be seen when additional surfaces, in this case even inverted sloped surfaces, are covered with a light diffusing layer. For scheme (e), variation in color is extremely small, and there is a luminance gradient of just 1.27× across an at the 3 different measurement angles. By comparison, for light extraction scheme (f), where the same light extraction block is used, but only one planar surface is covered with a light extraction sheet, there is a luminance gradient of 4.29× across an angle of 45°.

The above measurements show advantages of light extraction scheme (e), in which additional non-parallel surfaces of a light extraction block are covered with a light diffusing layer. Additionally, disposing a light diffusing layer only onto the front surface does not ensure uniform luminance and color across all viewing angles, and it does not give the 2-dimensional OLED panel a 3-dimensional appearance.

Figure 17:
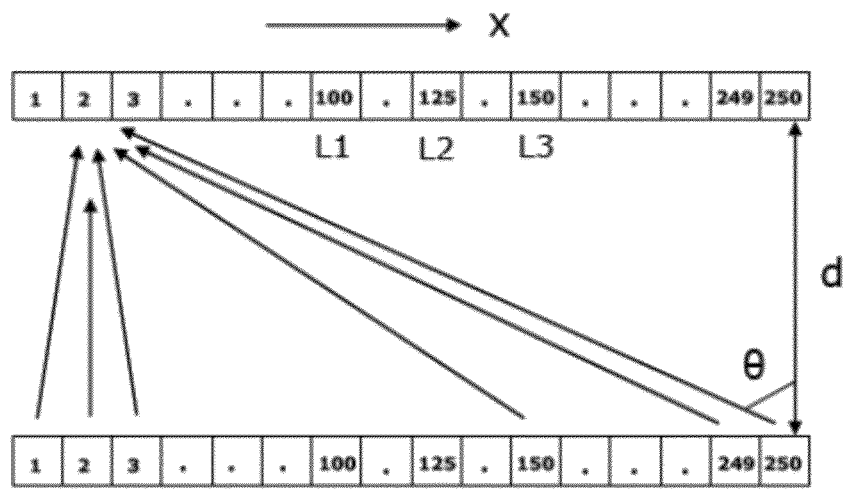
FIG. 17 is a schematic showing an optical model for predicting light extraction block thickness.

Based on these, and other experiments, the inventors have developed a model to estimate the minimum optical path length necessary from emissive surface to light scattering surface to hide a non-emissive region of a given dimension. This can be used to calculate the required thickness (height) of the light extraction block needed for a given OLED light panel layout. The model assumes an emissive surface comprising 250 equal sized units arranged along a line, where units 1-35 are Lambertian emitters, units 36-43 are non-emissive, units 44-78 are Lambertian emitters, units 79-86 are non-emissive, units 87-121 are Lambertian emitters, units 122-129 are non-emissive, units 130-164 are Lambertian emitters, units 165-172 are non-emissive, units 173-207 are Lambertian emitters, units 208-215 are non-emissive, and units 216-250 are Lambertian emitters. This is depicted in FIG. 17. This is an approximate representation of the OLED panel layout as in FIG. 3, where there are six equally spaced lighting stripes. The scattering surface lies in parallel and at a distance (d) from the emissive surface. The scattering surface is also divided into 250 equal sized units. The light intensity at each surface unit is calculated as:

$$I_S = \sum_{n=1}^{250} \frac{\cos(\theta_n)}{(x_n + d_n)^2}$$

It is the weighted sum from each unit of the emissive surface. If each unit is assumed to represent a length of 0.2 mm, then each emissive region has width=7.0 mm (35 units), and each non-emissive region has width=1.6 mm (8 units). This is approximately the same as for the panel layout in FIG. 3, except that the emissive region in FIG. 3 has width=69 mm, instead of 70 mm.

By varying (d), which corresponds to the distance between the emissive surface and the scattering surface, the inventors can predict the thickness of light extraction block required to give uniformity>80% for the OLED light panel layout in FIG. 3, and the like. Uniformity=L2/([L1+L3]/2), as labeled in FIG. 17.

Figure 18:
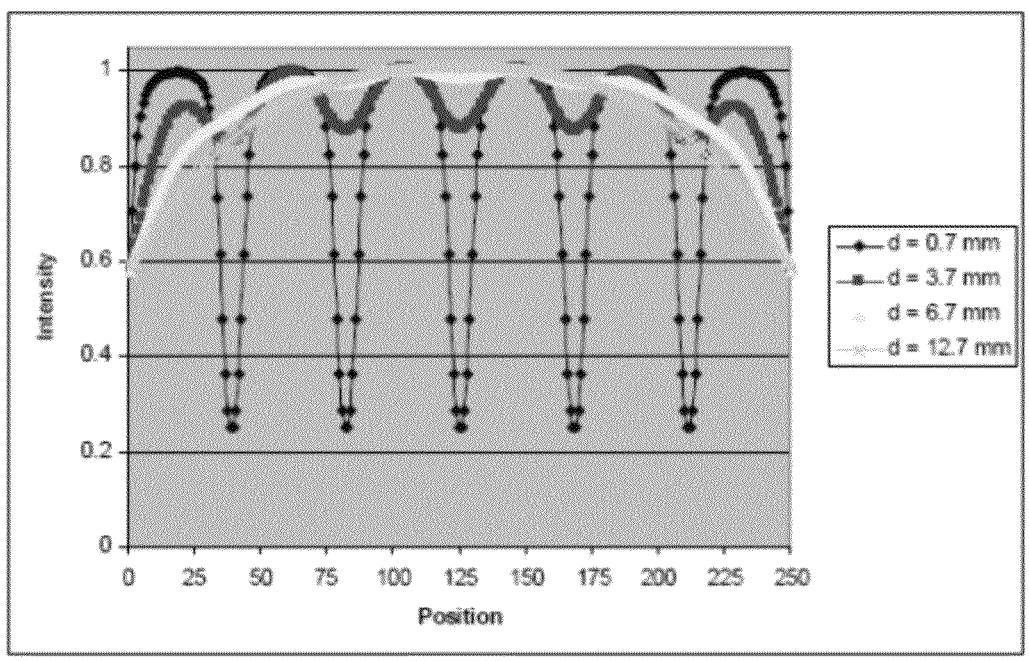
FIG. 18 is a graph showing test results including intensity at the surface of a light diffusing layer.

FIG. 18 shows $I_S$ plotted across the scattering surface for d=0.7 mm, 3.7 mm, 6.7 mm of 12.7 mm. For a substrate of thickness=0.7 mm, this corresponds to extraction block thickness=0, 3 mm, 6 mm or 12 mm, respectively. Uniformity predicted by this simple model is shown in column 2 of Table 4 for different light extraction block thickness. Also shown in column 3 of Table 4 is actual data recorded for the OLED light panel previously discussed (OLED device stack is shown in FIG. 2, while OLED light panel layout is shown in FIG. 3). Measurements were taken at normal incidence at positions L1, L2 and L3 on the scattering surface using a PR705 spectrophotometer. These positions correspond to the center of each of the central two stripes (L1 and L3) and at the center of the nonemissive stripe lying between the central two stripes (L2). Data was collected at constant current density J=10 mA/cm².

In Table 4, the uniformity across the scattering surface for different light extraction block thicknesses are shown. Column 2 shows predicted uniformity data from a simple model, while Column 3 shows uniformity measured at normal incidence to the scattering surface.

TABLE 4

| Block Thickness | Uniformity (Model) | Uniformity (Measured) |
|---|---|---|
| 0 mm | 25.2% | 32.6% |
| 3 mm | 87.8% | 82.3% |
| 6 mm | 98.5% | 93.4% |
| 12 mm | 100.9% | 99.6% |

As can be seen in Table 4, the uniformity across the scattering surface can be improved by increasing the distance between the emissive surface and the scattering surface. The experimental data shows that a non-emissive region of width=2.0 mm requires light extraction block thickness>3.0 mm for >82% uniformity, and light extraction block thickness>6.0 mm for >93% uniformity. Similar models and measurements could readily be made for other non-emissive region widths and block thicknesses. Similar calculations could also be performed to determine the minimum light extraction block thickness required to approximately completely mix red, green and blue emissive regions of given dimensions.

According to aspects of the present invention, light extraction efficacy may be improved, while providing approximately uniform emission intensity and color across a wide variety of viewing angles. Such features may also present the aesthetic and commercial advantages of transforming a 2-dimensional OLED panels into an apparently 3-dimensional light source, or a cloud of light, as well as offering the potential to improve illumination away from the surface normal. Moreover, these objects may be achieved, while maintaining a relatively thin form factor, which is also commercially significant.

Figure 19:
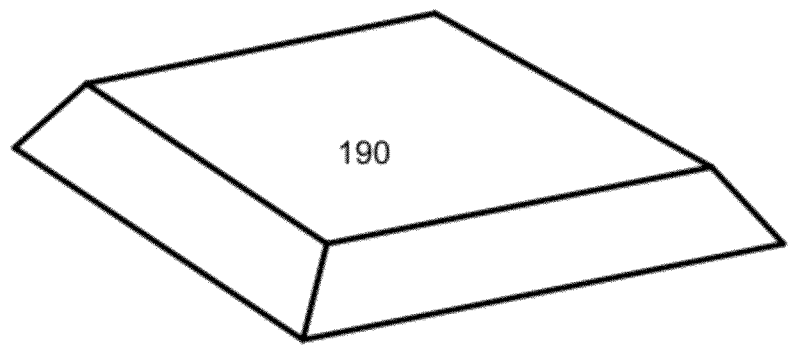
FIG. 19 is an isometric view of an exemplary light extraction block including a truncated pyramid shape according to aspects of the invention.

For example, as show in FIG. 19, a relatively thin-form OLED panel with a light extraction block 190 including a truncated pyramid shape may provide improved apparently 3-dimensional lighting from a 2-dimensional source. A plurality of the light panels 190 may be arranged together to form various lighting configurations.

Figure 20:
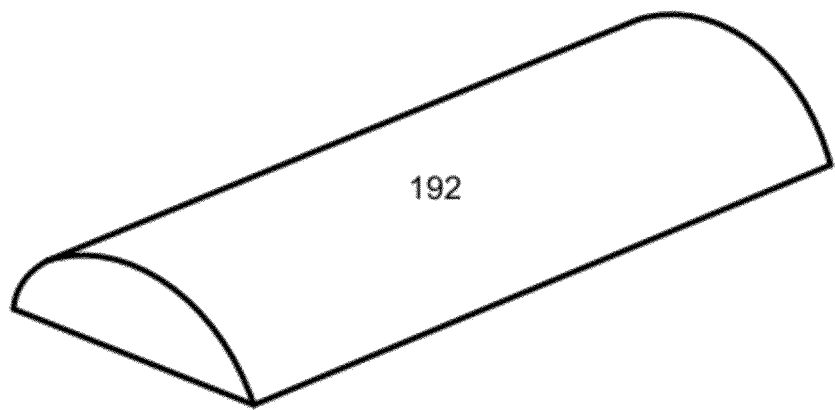
FIG. 20 is an isometric view of another exemplary light extraction block including a partial cylinder shape according to aspects of the invention.

By way of further example, as show in FIG. 20, a relatively thin-form OLED panel with a light extraction block 192 including a partial cylinder shape may also provide improved lighting from a 2-dimensional source. Light panel 192 includes a developable surface that can be used to direct light in additional directions beyond the normal of the light emitter. As with light panel 190, a plurality of the light panels 192 may also be arranged together to form various lighting configurations.

Through the use of features, including, for example, light diffusing layers on various surfaces of the light extraction block, imperfections may be hidden, colors may be mixed effectively, and pixilation or shorted sub-pixels may be disguised. For example, small black spots are not visible when the light is sufficiently scattered, and light from different colored subpixels can be mixed. For example, light from individual red green and blue sub-pixels can be mixed prior to emission from the scattering surface. Also, panels that are pixilated can appear as uniform clouds of light, even if there are significant non-emissive areas. Aspects of these, and other, benefits can be achieved, in part, through the additional optical distance from the emissive substrate surface to the surface scattering layer.

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments.

What is claimed is:

1. A lighting panel, comprising:
   a light source including an OLED panel;
   a light extraction block optically coupled to the light source and including a plurality of non-parallel light emitting surface normals; and
   at least one light diffusing layer covering a surface of the light extraction block;
   wherein the light extraction block is coupled to and refractive index matched with: a light emitting surface of the light source; or with a refractive index matching material positioned between the light extraction block and the light emitting surface of the light source.

2. The lighting panel of claim 1, wherein the plurality of light emitting surface normals are located on different non-parallel light emitting surfaces of the light extraction block.

3. The lighting panel of claim 1, wherein all light emitting surfaces of the light extraction block are covered by a light diffusing layer.

4. The lighting panel of claim 3, wherein a light diffusing layer is located between the light extraction block and the light source.

5. The lighting panel of claim 3, wherein no light diffusing layer is located between the light extraction block and the light source.

6. The lighting panel of claim 1, wherein the light source is inset within the light extraction block.

7. The lighting panel of claim 1, Wherein the light source does not physically penetrate any surface of the light extraction block.

8. The lighting panel of claim 1, wherein at least one of an optical emission intensity and an optical emission color from the plurality of light emitting surface normals are substantially equal.

9. The lighting panel of claim 1, wherein the at least one light diffusing layer is located between the light extraction block and the light source.

10. The lighting panel of claim 1, wherein the light extraction block includes at least one of an emitting surface that is in a non-parallel plane to that of the light emitting surface of the light source and a curved emitting surface.

11. The lighting panel of claim 1, wherein a height of the light extraction block is between 3 mm and 50 mm.

12. The lighting panel of claim 1, wherein a height of the light extraction block is approximately 10 mm.

13. The lighting panel of claim 11, wherein a height of the light extraction block is approximately 20 mm.

14. The lighting panel of claim 11, wherein a height of the light extraction block is less than one third of a cross-sectional width of the lighting panel.

15. The lighting panel of claim 1, wherein at least one of the light emitting surfaces includes a substantially curved surface, and a height of the light extraction block is less than 50% of a 50 width of the light extraction block.

16. The lighting panel of claim 1, wherein the light extraction block is refractive index matched with the light emitting surface of the light source.

17. The light panel of claim 1, wherein the light extraction block is refractive index matched with the index matching material positioned between the light extraction block and the light emitting surface of the light source.

18. The lighting panel of claim 1, wherein the light extraction block is formed from at least one of glass, acrylic, polycarbonate, quartz, PMMA, PET and PEN.

19. The lighting panel of claim 1 wherein the OLED panel comprises an array of lit and unlit areas.

20. The lighting panel of claim 1, wherein. the OLED panel comprises an array of multicolored emissive areas.

21. The lighting panel of claim 1, wherein a difference between refractive indices of the light extraction block and the light emitting surface of the light source or the refractive index matching material is less than 0.10.

22. The lighting panel of claim 1, wherein a difference between refractive indices of the light extraction block and the light emitting surface of the light source or the refractive index matching material is less than 0.05.

23. The lighting panel of claim 1, wherein a difference between refractive indices of the light extraction block and the light emitting surface of the light source or the refractive index matching material is less than 0.02.

24. The lighting panel of claim 1, wherein a difference between refractive indices of the light extraction block and the light emitting surface of the light source or the refractive index matching material is less than 0.01.

25. A light extraction block for use with a lighting panel, the light extraction block comprising:
   at least one light emitting surface;
   a plurality of non-parallel light emitting surface normals; and
   a light diffusing layer positioned along at least one surface of the light extraction block;
   wherein the light extraction block is coupled to and refractive index matched with: a light emitting surface of the lighting panel; or with a refractive index matching material positioned between the light extraction block and the light emitting surface of the lighting panel.

26. A method of manufacturing a light extraction block for use with a lighting panel, the method comprising:
   providing a light extraction block including at least one light emitting surface and a plurality of non-parallel light emitting surface normals; and
   positioning a light diffusing layer along at least one surface of the light extraction block;
   wherein the light extraction block is coupled to and refractive index matched with: a light emitting surface of the lighting panel; or with a refractive index matching material positioned between the light extraction block and the light emitting surface of the lighting panel.

* * * * *